United States Patent [19]
Fujimoto

[11] Patent Number: 6,148,043
[45] Date of Patent: Nov. 14, 2000

[54] VITERBI DECODER AND VITERBI DECODING METHOD

[75] Inventor: Kensuke Fujimoto, Kanagawa, Japan

[73] Assignee: Sony Corporation, Tokyo, Japan

[21] Appl. No.: 08/972,936

[22] Filed: Nov. 18, 1997

[30] Foreign Application Priority Data

Nov. 19, 1996 [JP] Japan ..................... 8-307666

[51] Int. Cl.⁷ .................................................. H04L 27/06
[52] U.S. Cl. ........................................... 375/341; 375/262
[58] Field of Search .................................... 375/262, 263,
375/264, 265, 290, 291, 340, 341, 342;
341/56, 107; 360/39, 65; 371/43

[56] References Cited

U.S. PATENT DOCUMENTS 5,287,385  2/1994  Sugawara et al. ...................... 375/341
5,608,737  3/1997  Kimura et al. ............................ 371/30
5,781,590  7/1998  Shiokawa et al. ...................... 375/341
5,907,586  5/1999  Katsuragawa et al. ................. 375/341

*Primary Examiner*—Stephen Chin
*Assistant Examiner*—Chieh M. Fan
*Attorney, Agent, or Firm*—Limbach & Limbach, LLP

[57] ABSTRACT

In a branch metric calculating circuit, using a sample value 'y' input from an A/D converter and reference levels {−1, −½, ½, 1}, branch metric calculation is performed by squaring a difference between the sample value 'y' and each of the reference levels and subtracting the square of the sample value 'y' from the resultant value of squaring the difference. Since actual calculation is carried out for values 2y, y−¾, −y−¾ and −2y in this arrangement, square operation circuits can be eliminated, thereby making it possible to simplify a configuration of a Viterbi decoder.

11 Claims, 9 Drawing Sheets

F I G. 2
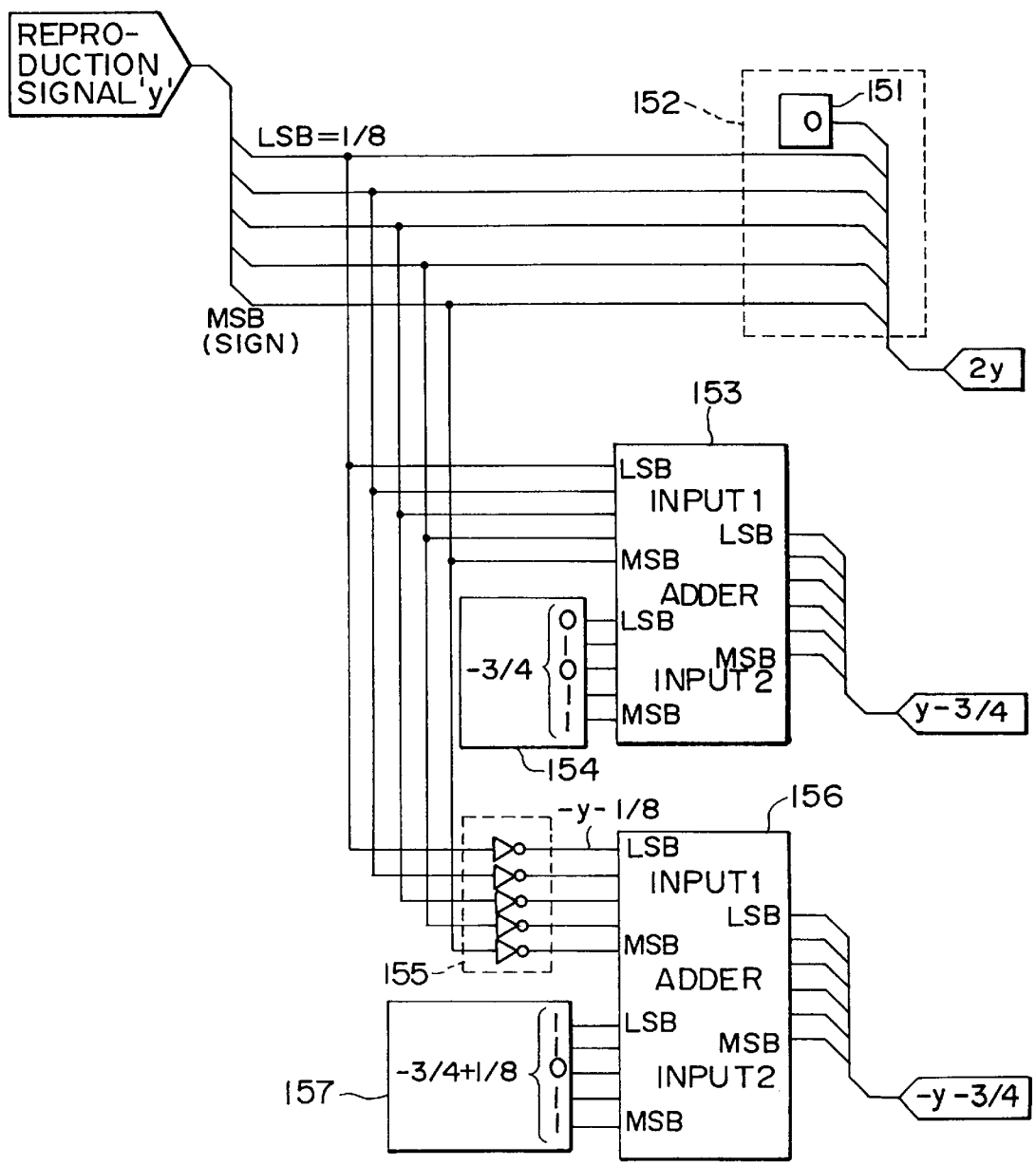

FIG. 4

| | INPUT | VALUE STORED |
|---|---|---|
| BIT NO. | 7 6 5 4 3 2 1 0 | 7 6 5 4 3 2 1 0 |
| FOUR VALUES INCLUDE POSITIVE AND NEGATIVE VALUES MIXEDLY | * * * * * * * * | * * * * * * * * |
| | 0 0 * * * * * * | 1 1 * * * * * * |
| | 0 1 * * * * * * | 0 0 * * * * * * |
| FOUR VALUES ARE ALL POSITIVE | 1 0 * * * * * * | 1 1 * * * * * * |
| FOUR VALUES ARE ALL NEGATIVE | 1 1 * * * * * * | 0 0 * * * * * * |

(* INDICATES AN ARBITRARY VALUE)

A/D CONVERTER OUTPUT

| | | | | | | |
|---|---|---|---|---|---|---|
| −1 | 1 | 1 | 0 | 0 | 0 | (18H) |
| −½ | 1 | 1 | 1 | 0 | 0 | (1CH) |
| ½ | 0 | 0 | 1 | 0 | 0 | (04H) |
| 1 | 0 | 1 | 0 | 0 | 0 | (08H) |

SIGNAL LEVEL ↑ SIGN ↑ 1 ↑ ½ ↑ ¼ ↑ ⅛

CHANNEL BIT DATA / SIGNAL LEVEL

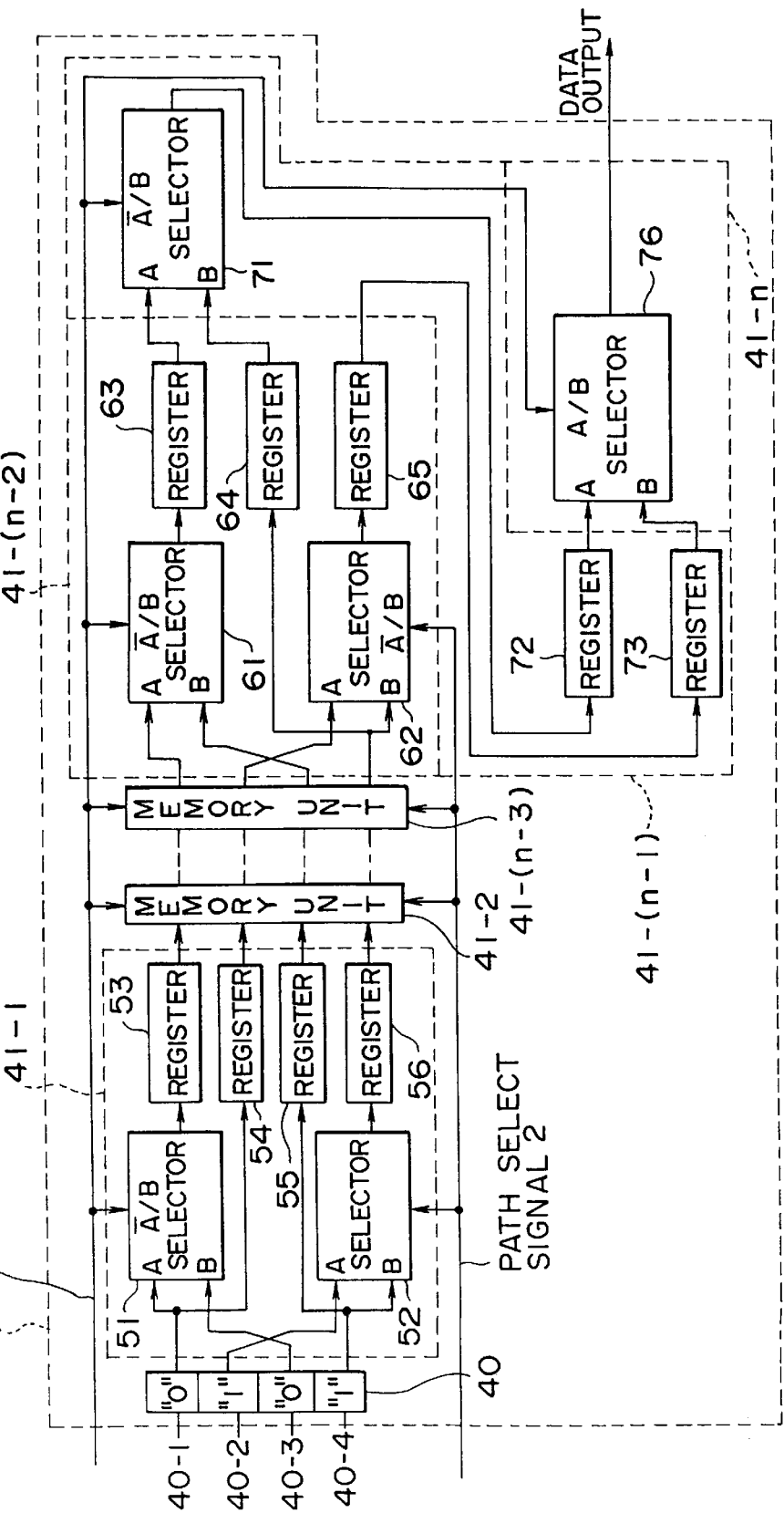

VITERBI DECODER AND VITERBI DECODING METHOD

BACKGROUND OF THE INVENTION

1. Field of the Invention

The present invention relates to Viterbi decoders and Viterbi decoding methods, and more particularly to a Viterbi decoder and a Viterbi decoding method for realizing a simplified circuit configuration.

2. Description of Related Art

In connection with digital data reproducing apparatus such as optical disk drive and magnetic disk drive equipment, a PRML (Partial Response Maximum-Likelihood) which is a combination of partial response and Viterbi decoding methods has been known as a technique for reducing a data error rate, improving reliability, and increasing recording density. Where the PRML is applied to optical disk drive equipment, a PR (1,1) or PR (1,2,1) method providing a low-pass partial response characteristic is employed. The PR (1,2,1) method, which provides a larger degree of attenuation in a high frequency range than the PR (1,1) method, is more suitable for high-density recording.

It has also been known that, in a circuit where NRZI (Non Return to Zero Inverted) recording is performed for modulation codes with minimum run limited to 1 as in the case of RLL (Run Length Limited) (1,7) codes, improvement in data error rate and reduction in circuit scale can be made by arranging a Viterbi decoder which works on a basis of state transition precluding data series violating run limitation, i.e., data series having an inversion time of 1T ('T' represents a clock cycle of one channel).

Referring to FIG. 6, there is shown a trellis diagram of PR (1,2,1) with minimum run limited to 1. In this figure, each state is indicated as a set of channel bit data including the last two bits with respect to the time point of interest (a value of the immediately preceding channel bit and a value of the channel bit further preceding it). In case that there is no run limitation, it is ideal to provide five values for the number of signal levels in equalization to PR (1,2,1). As contrasted, in case that the minimum run is limited to 1, four values {−1, −½, ½, 1} are provided for the number of ideal reproduction signal levels (reference levels).

In FIG. 6, the arrow mark indicates a direction of state transition. For instance, in case that an original state is 00 (a value of the immediately preceding channel bit and a value of the channel bit further preceding it), if a new channel bit is 1, the reproduction signal level becomes −½ and the preceding three channel bits become 001. In state transition, a new state becomes 01 (values of the preceding two channel bits). That is, the current state becomes 01 since the current channel bit is 1 and the preceding channel bit is 0.

In another example that an original state is 10, if a new channel bit is 0, the reproduction signal level becomes −½ and the preceding three channel bits become 100. Therefore, a new state becomes 00 (values of the preceding two channel bits).

In a simple combinational situation, there may be 16 (=4×4) possible state transitions. In FIG. 6, transitions not marked with an arrow do not take place in PR (1,2,1) with minimum run limitation. In Viterbi decoding, therefore, such transitions are not taken into consideration in principle.

Referring to FIG. 7, there is shown an example of a Viterbi decoder configuration arranged for PR (1,2,1) equalization and reproduction signaling with minimum run limited to 1. A Viterbi decoder evaluates likelihood of every possible data pattern and outputs reproduction data corresponding to a pattern having maximum likelihood. As shown in FIG. 7, the Viterbi decoder basically comprises a branch metric calculating circuit 1, an ACS (add-compare-select) circuit 2, ametric memory 3 andapath memory 4.

The branch metric calculating circuit 1 carries out branch metric calculation for determining the square of a difference between a reproduction signal sample value 'y' and each of four ideal levels (reference levels) of PR (1,2,1) signal.

More specifically, the branch metric calculating circuit 1 calculates the square of a difference between the sample value 'y' and the reference level −1 $((y-(-1))^2=(y+1)^2)$, the square of a difference between the sample value 'y' and the reference level −½ $((y-(-½))^2=(y+½)^2)$, the square of a difference between the sample value 'y' and the reference level ½ $((y-½)^2)$, and the square of a difference between the sample value 'y' and the reference level 1 $((y-1)^2)$.

The ACS circuit 2 comprises adders 11 to 16, comparators 17 and 18, and selectors 19 and 20. The adder 11 calculates the sum of output data of the branch metric calculating circuit 1 $(y+1)^2$ and path metric data held in register 32 of the metric memory 3, and supplies it to terminals A of the comparator 17 and the selector 19. The adder 12 calculates the sum of output data of the branch metric calculating circuit 1 $(y+½)^2$ and path metric data held in register 34 of the metric memory 3, and supplies it to terminals B of the comparator 17 and the selector 19.

The adder 13 calculates the sum of output data of the branch metric calculating circuit 1 $(y+½)^2$ and path metric data held in the register 32 of the metric memory 3, and supplies it to a normalizing circuit 31 of the metric memory 3. The adder 14 calculates the sum data of output of the branch metric calculating circuit 1 $(y-½)^2$ and path metric data held in register 35 of the metric memory 3, and supplies it to the normalizing circuit 31.

The adder 15 calculates the sum of output data of the branch metric calculating circuit 1 $(y-½)^2$ and path metric data held in register 33 of the metric memory 3, and supplies it to terminals A of the comparator 18 and the selector 20. The adder 16 calculates the sum of output data of the branch metric calculating circuit 1 $(y-1)^2$ and path metric data held in the register 35 of the metric memory 3, and supplies it to terminals B of the comparator 18 and the selector 20.

Each of the comparators 17 and 18 compares values input to terminals A and B thereof, and delivers a path select signal 1 or 2, respectively, for letting the selector choose a smaller input value on terminal A or B. According to the path select signal 1, the selector 19 selects a smaller input value on terminal A or B, and outputs it to the normalizing circuit 31. Similarly, according to the path select signal 2, the selector 20 selects a smaller input value on terminal A or B, and outputs it to the normalizing circuit 31.

The normalizing circuit 31 carries out normalization as mentioned below: If each of the registers 32 to 35 continues accumulating input values, an overflow will take place eventually. To prevent this, a certain value is subtracted from values to be supplied to the registers 32 to 35 so that values in the registers 32 to 35 will be within a predetermined value range while maintaining relative magnitude relationship of path metric data.

The path select signals 1 and 2 output from the comparators 17 and 18 of the ACS circuit 2 are fed to memory units 41-1 to 41-n of the path memory 4. The memory unit 41-1 of the path memory 4 comprises selectors 51 and 52 and registers 53 to 56. On the selector 51, terminals A and B thereof receive input '0' from the topmost register 40-1 of the preceding-stage register block 40 and input '0' from the third-level register 40-3. According to the path select signal 1, an input signal at one of the terminals is selected, and output is fed to the register 53. On the selector 52, terminals A and B thereof receive input '1' from the second-level register 40-2 of the register block 40 and input '1' from the bottommost register 40-4. According to the path select signal 2, an input signal at one of the terminals is selected, and output is fed to the register 56. The registers 54 and 55 are supplied with '0' and '1' from the registers 40-1 and 40-4, respectively.

Each of the memory units 41-2 to 41-(n-3) comprises two selectors and four registers as in the memory unit 41-1.

Three memory units 41-(n-2), 41-(n-1), and 41-n in the succeeding stages are arranged in a simpler structure than the preceding memory units.

In the memory unit 41-(n-2), terminals A and B of selector 61 receive input from the topmost register and third-level register of the preceding-stage memory unit 41-(n-3), respectively. According to the path select signal 1, an input signal at one of the terminals is selected, and output is fed to register 63. On selector 62, terminals A and B receive input from the second-level register and bottommost register of the preceding-stage memory unit 41-(n-3), respectively. According to the path select signal 2, an input signal at one of the terminals is selected, and output is fed to register 65. Register 64 is supplied with output of the bottommost register of the memory unit 41-(n-3).

On selector 71 of the memory unit 41-(n-1), terminal A thereof receives input from the register 63 and terminal B thereof receives input from the register 64 of the memory unit 41-(n-2). According to the path select signal 1, the selector 71 selects an input signal at terminal A or B and feeds it to register 72. Register 73 is supplied with output of the register 65.

Selector 76 of the memory unit 41-n selects one of signals input to terminals A and B thereof from the registers 72 and 73 according to the path select signal 1, delivering the output result of Viterbi decoding.

The following will now describe decoding algorithmic operations: A pattern of channel bit data can be expressed as a path in a trellis diagram. An ideal reproduction signal going through this path (i.e., a data pattern having contiguous reference levels) contains noise and distortion in an actual operational application. A degree of closeness between actual and ideal reproduction signals is indicated as a path metric value representing the sum of products of branch metric data.

In case of optical disk digital data, the square of Euclidean distance (sum of squares of differences between reference levels and actual reproduction signal levels at respective time points) is used as a path metric value. In Viterbi decoding, a pattern having maximum likelihood is output as reproduction data, which means a search for a path that provides a minimum path metric value. For path metric determination, it is necessary to calculate each branch metric value, i.e., the square of a difference between reference and actual reproduction signal levels at each point of time. A path metric value can be determined by summing products of branch metric values thus attained.

Since there are four possible states (values of the immediately preceding two channel bits), four possible paths having minimum path metric data exist for respective states.

In contrast, there are six possible transitions to these four states as shown in FIG. 6. That is, the following six transitions are possible: transition through which original state 00 is changed to new state 00 having the latest two channel bit values by receiving new channel bit data 0; transition which original state 10 is changed to new state 00 by receiving new channel bit data 0; transition through which original state 00 is changed to new state 01 by receiving channel bit data 1; transition through which original state 11 is changed to new state 10 by receiving channel bit data 0; transition through which original state 01 is changed to new state 11 by receiving channel bit data 1; and transition through which original state 11 is changed to new state 11 by receiving channel bit data 1.

In the ACS circuit 2, each of the adders 11 to 16 is used to calculate path metric data corresponding to these six state transitions.

More specifically, in transition where original state 00 is changed to new state 00 by receiving channel bit data 0, since the reference signal level is $-1$, the adder 11 provides a path metric value for new state 00 by adding branch metric data $(y-(-1))^2$, supplied from the branch metric calculating circuit 1 based on sample value 'y' and reference level $-1$, and path metric data of original state 00 held in the register 32.

Similarly, in transition where original state 10 is changed to new state 00, the adder 12 provides a path metric value for new state 00 by adding branch metric data $(y-(-\frac{1}{2}))^2$, supplied from the branch metric calculating circuit 1 based on sample value 'y' and reference level $-\frac{1}{2}$, and path metric data of original state 10 held in the register 34.

In the comparator 17, a path metric magnitude output by the adder 11 for transition from original state 00 to new state 00 is compared with a path metric magnitude output by the adder 12 for transition from original state 10 to new state 00, and the path select signal 1 for selecting a smaller value is fed to the selector 19. As a result, a smaller value of path metric magnitude data corresponding to transition from original state 00 to new state 00 and path metric magnitude data corresponding to transition from original state 10 to new state 00 is selected by the selector 19 and supplied to the normalizing circuit 31.

As shown in FIG. 6, new state 01 is reached only through transition from original state 00. Therefore, the adder 13 provides a new path metric value for new state 01 by adding branch metric data $(y-(-\frac{1}{2}))^2$, supplied from the branch metric calculating circuit 1 based on sample value 'y' and reference level $-\frac{1}{2}$, and path metric data of original state 00 held in the register 32. Then, the attained path metric value is fed to the normalizing circuit 31.

Also, as shown in FIG. 6, new state 10 is reached only through transition from original state 11. Therefore, the adder 14 provides a path metric value for new state 10 by adding branch metric data $(y-\frac{1}{2})^2$, supplied from the branch metric calculating circuit 1 based on reference level $\frac{1}{2}$, and path metric data of original state 11 held in the register 35. Then, the attained path metric value is fed to the normalizing circuit 31.

New state 11 is reached through two possible transitions from original states 01 and 11. For transition to new state 11, therefore, the processing for selecting a smaller value of path metric magnitude data corresponding to two possible transitions is carried out as in the case of transition to new state 00.

To be more specific, in path metric calculation for transition from original state 01 to new state 11, the adder 15 adds branch metric data $(y-\frac{1}{2})^2$, supplied by the branch metric calculating circuit 1 based on reference level $\frac{1}{2}$, and path metric data of original state 01 held in the register 33.

Similarly, in path metric calculation for transition from original state 11 to new state 11, the adder 16 adds branch metric data $(y-1)^2$, supplied from the branch metric calculating circuit 1 based on reference level 1, and path metric data of original state 11 held in the register 35.

In the comparator 18, a path metric magnitude output by the adder 15 for transition from original state 01 to new state 11 is compared with a path metric magnitude for transition from original state 11 to new state 11, and the path select signal 2 is generated for selecting a smaller input value. According to the path select signal 2, the selector 20 selects one of input values from the adders 15 and 16, and feeds it to the normalizing circuit 31 as a path metric value for transition to new state 11.

In the normalizing circuit 31, a predetermined value is subtracted from each of four path metric values corresponding to new states 00, 01, 10 and 11. The resultant value of subtraction is stored into each of the registers 32 to 35 as a path metric value of new state.

The operations mentioned above are repeated in sequence. Each time a new sample value 'y' is attained, the path select signal 1 or 2 is generated and a path metric value corresponding to one of states 00 to 11 in each of the registers 32 to 35 is updated and retained.

As shown in FIG. 6, in transition to new state 00, a channel bit generated is 0 regardless of whether original state is 00 or 10. Similarly, in transition to new state 01, 10 or 11, a channel bit generated is 1, 0 or 1, respectively. Therefore, as a channel bit to be provided for transition to each of new states 00, 01, 10 and 11, each of the registers 40-1, 40-2, 40-3 and 40-4 holds 0, 1, 0 or 1 in advance. As shown in FIG. 8, four registers from the topmost level to the bottommost level in each memory unit 41-i are arranged to correspond to paths reaching states 00, 01, 10 and 11, respectively. For each path, channel bit data generated by the first-stage registers 40-1 to 40-4 is transferred to the succeeding stages sequentially according to the path select signal 1 or 2. In this fashion, a channel bit data sequence for each path is generated and retained.

Referring to FIG. 9, there is shown an example of formation of paths S0 to S3 based on data held in four registers in each memory unit 41-i corresponding to states 00, 01, 10 and 11. In this figure, data at the latest time 't' is indicated on the right side, and data at the immediately preceding time 't-1' is indicated on the left side. That is, the right-side memory unit of the path memory 4 in FIG. 7 is indicated on the left side in FIG. 9, and the left-side memory unit of the path memory 4 in FIG. 7 is indicated on the right side in FIG. 9.

In the example shown in FIG. 9, at the time 't-1', data of path S0 held in the topmost register contains 01100 in chronological order. Similarly, data of paths S1, S2 and S3 held in the second-level to fourth-level registers contain 11001, 01110, and 01111, respectively. Then, at the next time 't', the following state transitions are assumed to take place; from original state 10 to new state 00, from original state 00 to new state 01, from original state 11 to new state 10, and from original state 11 to new state 11. As mentioned above, in transition to new state 00, 01, 10 or 11, a channel bit generated is 0, 1, 0 or 1 respectively, each being held in each of the registers 40-1, 40-2, 40-3 and 40-4 in advance. In this situation, the immediately preceding channel bit data is transferred to the succeeding-stage registers as described below.

The immediately preceding channel bit data corresponding to states 00 to 11 must be transferred to the registers 53 to 56. As shown in FIG. 6, new state 00 maybe reached from original state 00 or 10. Therefore, a value contained in the register 40-1 corresponding to original state 00 or the register 40-3 corresponding to original state 10 is transferred to the register 53. The path select signal 1 is used to determine which value is to be transferred.

The adder 11 outputs a path metric value corresponding to transition from original state 00 to new state 00, and the adder 12 outputs a path metric value corresponding to transition from original state 10 to new state 00. For instance, if a path metric value corresponding to transition from original state 00 to new state 00 is smaller than that corresponding to transition from original state 10 to new state 00 and it is selected by the selector 19, a probability of transition from original state 00 to new state 00 is higher than that of transition from original state 10 to new state 00. Therefore, in this case, the selector 51 of the memory unit 41-1 selects input at terminal A thereof, and it is held in the register 53. In a case opposite to the above, a path metric value corresponding to transition from original state 10 to new state 00, which is output from the adder 12, is smaller than that corresponding to transition from original state 00 to new state 00, which is output from the adder 12. In this case, a path metric value corresponding to transition from original state 10 to new state 00 is selected by the selector 19 of the ACS circuit 2. Then, for this transition, the selector 51 selects input at terminal B thereof, and it is held in the register 53.

Transition to new state 01 is made from original state 00. Therefore, channel bit data held in the register 40-1 corresponding to original state 00 is supplied to the register 54.

Similarly, since transition to new state 10 is made from original state 11, channel bit data held in the register 40-4 corresponding to original state 11 is supplied to the register 55.

Transition to new state 11 is made from original state 01 or 11. Therefore, channel bit data held in the register 40-2 or 40-4 corresponding to original state 01 or 11 is selected by the selector 52 according to the path select signal 2 and supplied to the register 56.

As mentioned above, the immediately input channel bit data, which is presumed to be correct in path metric judgment, is transferred to and retained in the registers 53 to 56. On issuance of the path select signal 1 or 2, channel bit data held in the memory unit 41-1 is transferred to the succeeding-stage memory unit 41-2. The same operation is also performed in the memory units at further succeeding stages.

In the manner mentioned above, for paths S0 to S3 at the time 't', (011100), (011001), (011110) and (011111) are provided respectively as shown in FIG. 9.

In FIG. 9, the thick line indicates a path which remains still at a point of time concerned, and the thin line indicates a path which has been discontinued and recognized to be incorrect. In other words, one of the remaining continuous paths in FIG. 9 is selected finally, thereby defining one sequence of data.

In case of PR (1,2,1), data corresponding to 20 to 30 clocks is stored into the path memory 4 to determine one path finally. When one path is determined, values of data sequences S0 to S4 held in four levels of registers are matched mutually.

Therefore, in a memory unit at the final stage or in the vicinity of the final stage in the path memory 4, it is possible to simplify a configuration thereof. In the memory unit 41-(n-2) exemplified in FIG. 7, a value selected by these lector 61 is fed to the register 63, a value selected by the selector 62 is fed to the register 65, and a value output from the bottommost register of the preceding-stage memory unit 41-($n$-3) is fed to the register 64. In the memory unit 41-($n$-2), the second-level register is eliminated since the relevant data sequence has been defined already.

Further, in the memory unit 41-($n$-1), the selector 71 selects output from the register 63 or 64, and a selected value is retained in the register 72. The bottommost register 73 holds a value output from the bottommost register 65 of the preceding stage. In this stage, the topmost register and the third-level register are eliminated.

In the final-stage memory unit 41-$n$, only the selector 76 is provided, through which output from the register 72 or 73 of the preceding-stage memory unit 41-($n$-1) is selected according to the path select signal 1 to deliver final data output.

As described above, in a conventional arrangement of a Viterbi decoder, it is required for the branch metric calculating circuit 1 to perform square operation, resulting in a disadvantage that the circuit scale is considerably large.

Still more, in the conventional Viterbi decoder, the metric memory 3 requires the largest bit width (operation word length), which has a significant effect on a speed of Viterbi decoding operation. This bit width requirement makes it difficult to increase an operation speed of the Viterbi decoder.

SUMMARY OF THE INVENTION

It is therefore an object of the present invention to provide a Viterbi decoder which has a simplified structure for enabling a higher speed of decoding operation.

In a Viterbi decoder according to one embodiment and a Viterbi decoding method according to another embodiment, calculation circuit means is arranged to calculate a branch metric value by squaring a difference between a sample value and each of plural reference levels and subtracting the square of the sample value from the resultant value of squaring the difference.

In a Viterbi decoder according to another embodiment and a Viterbi decoding method according to still another embodiment, if all the values selected by selection circuit means have the same algebraic sign, a value equal to ¼ of a numeric value range representable by the metric memory means is added to or subtracted from each of the selected values and the resultant value of addition or subtraction is stored as a path metric value in metric memory means.

In the Viterbi decoder mentioned above and the Viterbi decoding method mentioned above, a branch metric value is calculated by squaring a difference between a sample value and each of plural reference levels and subtracting the square of the sample value from the resultant value of squaring the difference, thereby making it possible to determine a branch metric value without performing square operation actually.

In the Viterbi decoder mentioned above and the Viterbi decoding method mentioned above, if all the values selected by selection circuit means have the same algebraic sign, a value equal to ¼ of a numeric value range representable by the metric memory means is added to or subtracted from each of the selected values and the resultant value of addition or subtraction is stored as a path metric value, thereby making it possible to reduce the circuit scale for realizing a higher speed of decoding operation.

The above and other objects, features and advantages of the present invention will become more apparent from the accompanying drawings, in which like reference numerals are used to identify the same or similar parts in several views.

BRIEF DESCRIPTION OF THE DRAWINGS

FIG. 2 is a block diagram showing a preferred embodiment of a branch metric calculating circuit 1 indicated in FIG. 1;

FIG. 4 is an illustration showing operations of the metric memory 3 presented in FIG. 3;

FIGS. 7A and 7B are block diagrams showing an example of a conventional Viterbi decoder configuration;

DETAILED DESCRIPTION OF THE PREFERRED EMBODIMENTS

Figure 1:
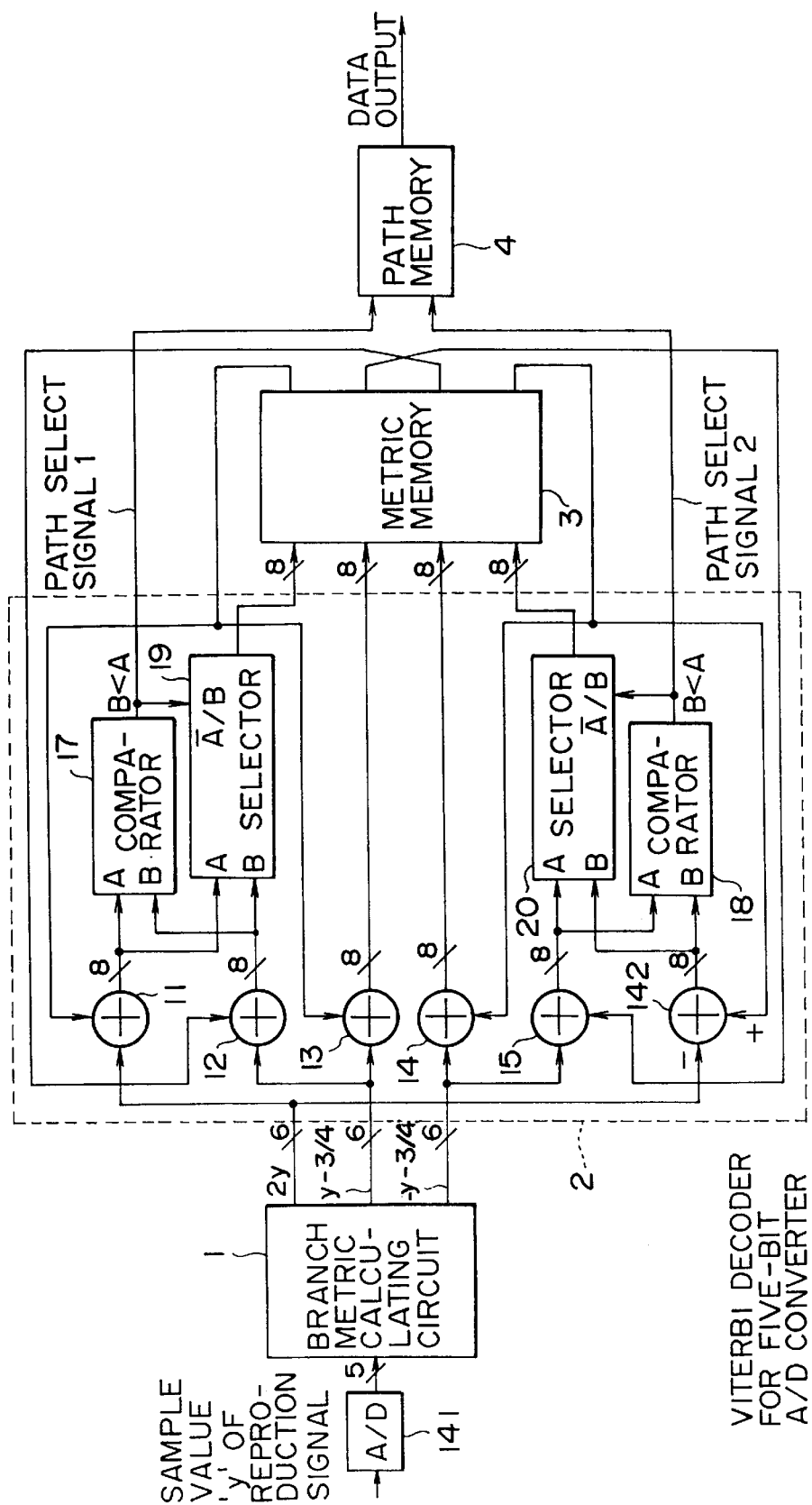
FIG. 1 is a block diagram showing a Viterbi decoder configuration in a preferred embodiment of this invention.

The present invention will now be described in further detail by way of example with reference to the accompanying drawings. In the following description of preferred embodiments, an example of each means is indicated in parentheses additionally for the purpose of clarifying relationship between each means mentioned in the appended claims and elements in the preferred embodiments presented herein, and therefore it is to be understood that features of the invention are not limited to the parenthesized specific examples of respective means.

A Viterbi decoder according to one embodiment comprises calculation circuit means for calculating a branch metric value using a sample value of reproduction signal and each of plural reference levels (e.g., branch metric calculating circuit 1 in FIG. 1), selection circuit means for selecting a particular value from sum data of plural branch metric values output by the calculation circuit means and path metric values corresponding to branch metric values (e.g., ACS circuit 2 in FIG. 1), metric memory means for storing a value selected by the selection circuit means as path metric data (e.g., metric memory 3 in FIG. 1), and path memory means for storing path data according to selection made by the selection circuit means (e.g., path memory 4 in FIG. 1), wherein the calculation circuit means calculates a branch metric value by squaring a difference between the sample value and each of plural reference levels and subtracting the square of the sample value from the resultant value of squaring the difference.

In a Viterbi decoder according to another embodiment, the calculation circuit means comprises adder means for adding a sample value and a predetermined constant (e.g., adders 153 and 156 in FIG. 2) and shifter means for shifting sample value bits (e.g., bit shifter 152 in FIG. 2).

In a Viterbi decoding method wherein a Viterbi decoder comprises calculation circuit means for calculating a branch metric value using a sample value of reproduction signal and each of plural reference levels (e.g., branch metric calculating circuit 1 in FIG. 1), selection circuit means for selecting a particular value from sum data of plural branch metric valued output by the calculation circuit means and path metric values corresponding to branch metric values (e.g., ACS circuit 2 in FIG. 1), metric memory means for storing a value selected by the selection circuit means as path metric data (e.g., metric memory in FIG. 1), and path memory means for storing path data according to selection made by the selection circuit means (e.g., path memory 4 in FIG. 1), the calculation circuit means is arranged to calculate a branch metric value by squaring a difference between the sample value and each of plural reference levels and subtracting the square of the sample value from the resultant value of squaring the difference.

A Viterbi decoder according to yet another embodiment comprises calculation circuit means for calculating a branch metric value using a sample value of reproduction signal and each of plural reference levels (e.g., branch metric calculating circuit 1 in FIG. 1), selection circuit means for selecting a particular value from sum data of plural branch metric values output by the calculation circuit means and path metric values corresponding to branch metric values (e.g., ACS circuit 2 in FIG. 1), metric memory means for storing a value selected by the selection circuit means as path metric data (e.g., metric memory 3 in FIG. 1), and path memory means for storing path data according to selection made by the selection circuit means (e.g., path memory 4 in FIG. 1), wherein if all the values selected by the selection circuit means have the same algebraic sign, a value equal to ¼ of a numeric value range representable by the metric memory means is added to or subtracted from each of the selected values and the resultant value of addition or subtraction is stored as a path metric value in the metric memory means.

In a Viterbi decoding method according to a further embodiment wherein a Viterbi decoder comprises calculation circuit means for calculating a branch metric value using a sample value of reproduction signal and each of plural reference levels (e.g., branch metric calculating circuit 1 in FIG. 1), selection circuit means for selecting a particular value from sum data of plural branch metric valued output by the calculation circuit means and path metric values corresponding to branch metric values (e.g., ACS circuit 2 in FIG. 1), metric memory means for storing a value selected by the selection circuit means as path metric data (e.g., metric memory 3 in FIG. 1), and path memory means for storing path data according to selection made by the selection circuit means (e.g., path memory 4 in FIG. 1), if all the values selected by the selection circuit means have the same algebraic sign, a value equal to ¼ of a numeric value range representable by the metric memory means is added to or subtracted from each of the selected values and the resultant value of addition or subtraction is stored as a path metric value in the metric memory means.

Figure 7A:
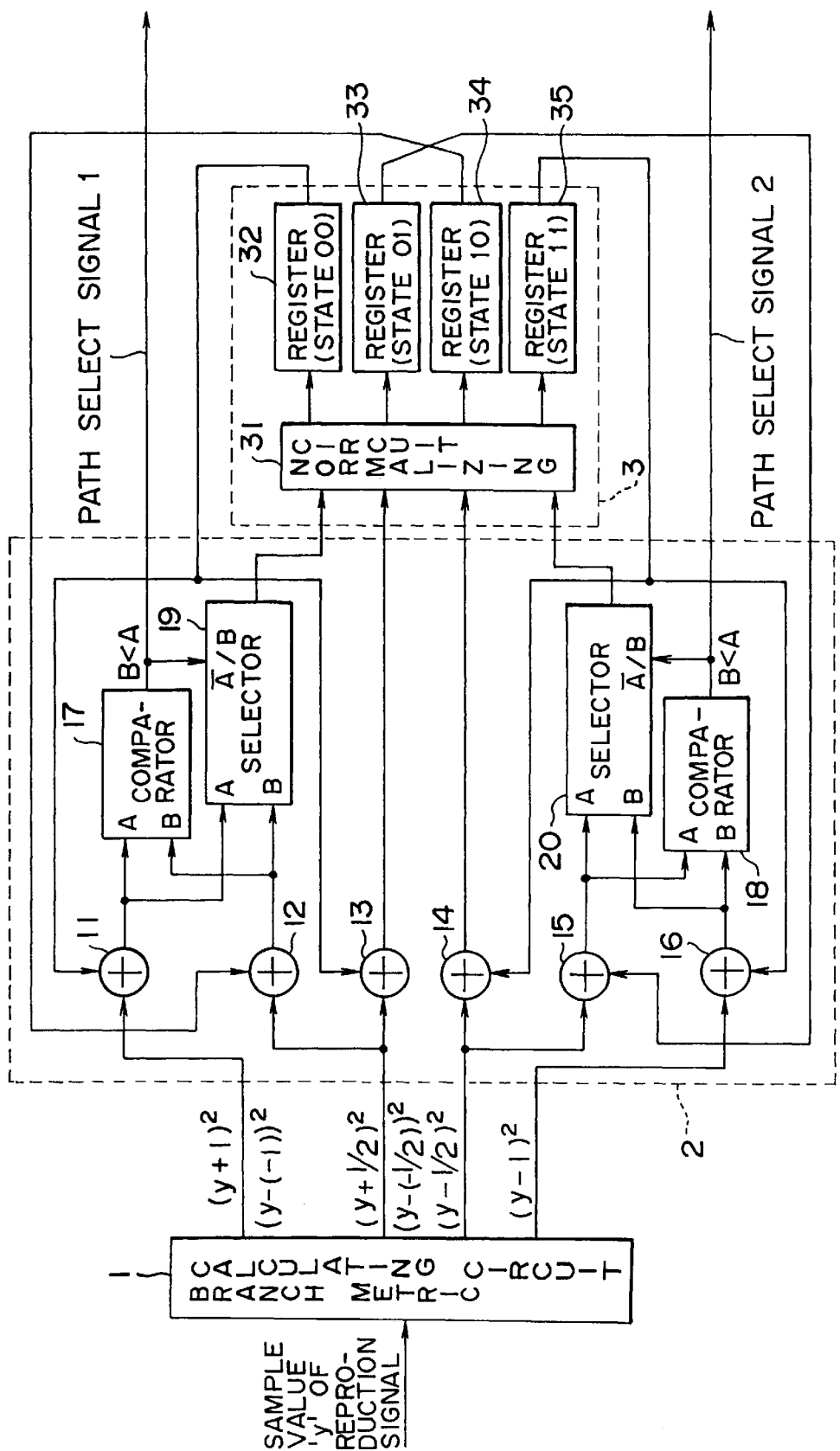
Figure 8:
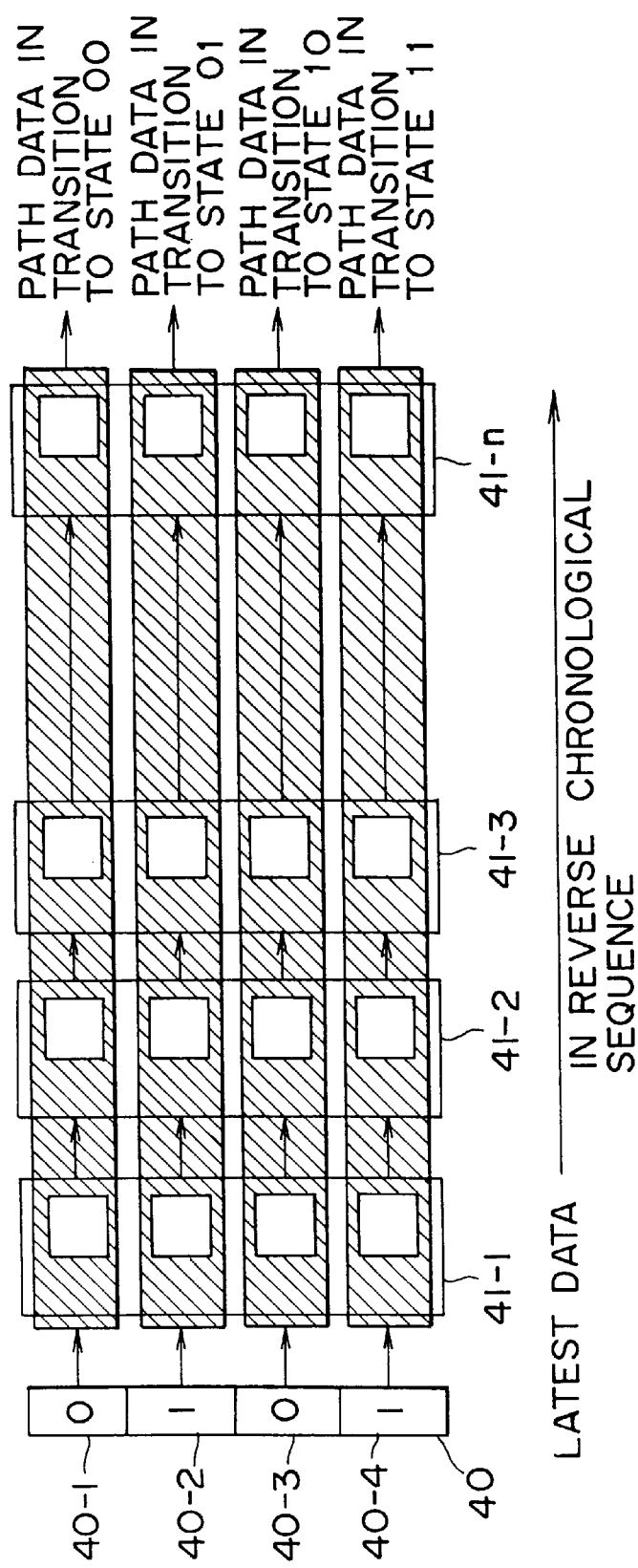
FIG. 8 is an illustration showing operations of a path memory.
Figure 9:
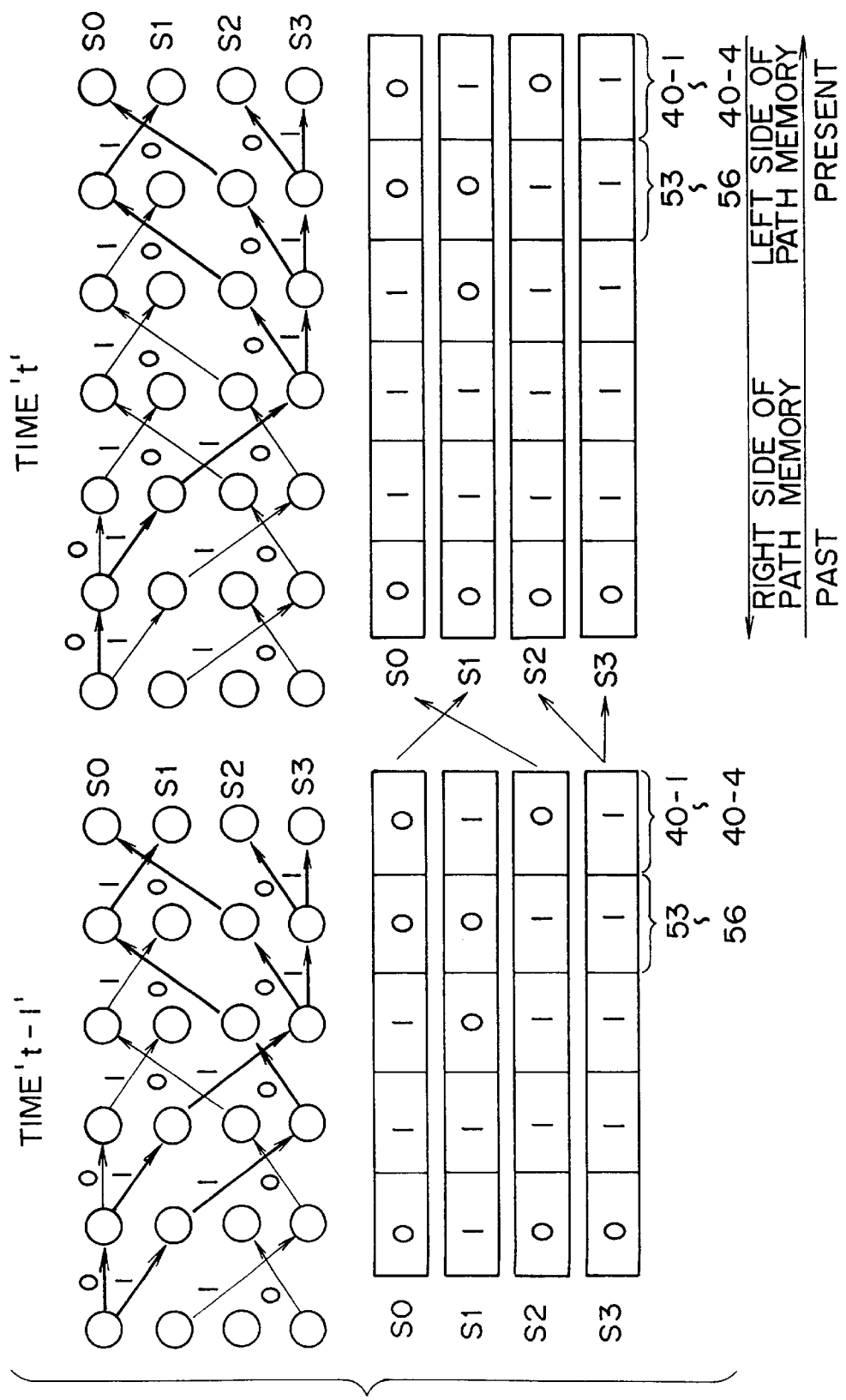
FIG. 9 is another illustration showing operations of the path memory.

Referring to FIG. 1, there is shown a block diagram of a Viterbi decoder configuration in a preferred embodiment of the present invention. In FIG. 7, like reference numerals are used to designate corresponding parts in this figure. Description of some parts is omitted in the following explanation for the purpose of succinctness.

In the preferred embodiment of the invention shown in FIG. 1, a reproduction signal from an optical disk is fed to an A/D converter 141 for A/D conversion and each sample value 'y' is represented in five bits, for example. Then, the sample value 'y' output by the A/D converter 141 is input to a branch metric calculating circuit 1 for branch metric calculation. In the branch metric calculating circuit 1, a difference between the sample value 'y' and each of reference levels is squared, and then the square of the sample value 'y' is subtracted from the resultant value of squaring the difference. This operation is represented in the following arithmetic expressions:

$$\{y-(-1)\}^2 - y^2 = 2y+1$$

$$\{y-(-½)\}^2 - y^2 = y+¼$$

$$\{y-(½)\}^2 - y^2 = -y+¼$$

$$\{y-1\}^2 - y^2 = -2y+1$$

Subtracting 1 from each of these expressions yields:

$$\{y-(-1)\}^2 - (y^2+1) = 2y$$

$$\{y-(-½)\}^2 - (y^2+1) = y-¾$$

$$\{y-½\}^2 - (y^2+1) = -y-¾$$

$$\{y-1\}^2 - (y^2+1) = -2y$$

As indicated above, branch metric calculation can be carried out without performing square operation actually. Subtracting the same value from branch metric data does not cause any problem as long as relative magnitude relationship is maintained.

Further, since value −2y can be attained by subtraction instead of addition, it is possible to omit calculation for determining −2y.

Referring to FIG. 2, there is shown a configuration of the branch calculating circuit 1 in a preferred embodiment of the invention. As indicated in this figure, five-bit sample data 'y' input from the A/D converter 141 is shifted by adding '0' held in a register 151 to it as the least significant bit (LSB) thereof. That is, through a bit shifter 152, the five-bit sample data is shifted one bit position toward the most significant bit (MSB) position to provide six-bit data. The bit shifter 152 outputs value 2y.

One of two input points of an adder 153 is supplied with the five-bit sample value 'y', and the other input point thereof is supplied with value −¾ from a register 154. Adding these two input values, the adder 153 outputs value y−¾.

One of input points of an adder 156 is supplied with value (−y−⅛) which has been provided by inverting each bit of the sample value 'y' through an inverter 155. The other input point of the adder 156 is supplied with value (−¾+⅛) held in a register 157. Adding these input values, the adder 156 outputs value (−y−¾).

Output from the branch metric calculating circuit 1 is fed to an ACS circuit 2. The ACS circuit 2 in the preferred embodiment shown in FIG. 1 is basically the same as a conventional ACS circuit 2 shown in FIG. 7, but an adder 16 in FIG. 7 is replaced with a subtracter 142 (reverse-polarity subtraction circuit).

The value 2y output from the branch metric calculating circuit 1 in FIG. 1 corresponds to output $(y-(-1))^2$ from a branch metric calculating circuit 1 in FIG. 7. Similarly, values (y−¾) and (−y−¾) output from the branch metric calculating circuit 1 in FIG. 1 correspond to $(y-(-½))^2$ and $(y-½)^2$ output from the branch metric calculating circuit 1 in FIG. 7, respectively. Therefore, values 2y, y−¾, and −y−¾ output from the branch metric calculating circuit 1 in FIG. 1 are supplied to adders 11 to 15 in the same manner as for $(y-(-1))^2$, $(y-(-½))^2$, and $(y-½)^2$ output from the branch metric calculating circuit 1 in FIG. 7.

Since value −2y is not calculated in the branch metric calculating circuit 1, value 2y is input to the subtracter 142 so that it is subtracted from a path metric value corresponding to state 11 held in a register 35 of a metric memory 3. Therefore, the ACS circuit 2 in FIG. 1 carries out the processing substantially equivalent to that by the ACS circuit 2 in FIG. 7.

Accordingly, it is possible to simplify the configuration of the branch metric calculating circuit 1 for reducing the circuit scale thereof.

In the branch metric calculating circuit 1, it is also possible to make arrangement for performing calculation according to the following arithmetic expressions:

$$\{y-(-1)\}^2-(y^2+\tfrac{1}{4})=2y+\tfrac{3}{4}$$

$$\{y-(-\tfrac{1}{2})\}^2-(y^2+\tfrac{1}{4})=y$$

$$\{y-\tfrac{1}{2}\}^2-(y^2+\tfrac{1}{4})=-y$$

$$\{y-1\}^2-(y^2+\tfrac{1}{4})=-2y+\tfrac{3}{4}$$

In this case, calculation for determining −y can also be omitted.

Since the Viterbi decoder in the preferred embodiment also handles negative values, each numeric value is indicated in twos complement representation.

A path memory 4 in FIG. 1 is configured in the same structure as that of a path memory 4 in FIG. 7. The metric memory 3 in FIG. 1 can be configured in the same structure as that of a metric memory 3 in FIG. 7, but it is also possible to configure the metric memory 3 of the present invention as shown in FIG. 3.

Figure 3:
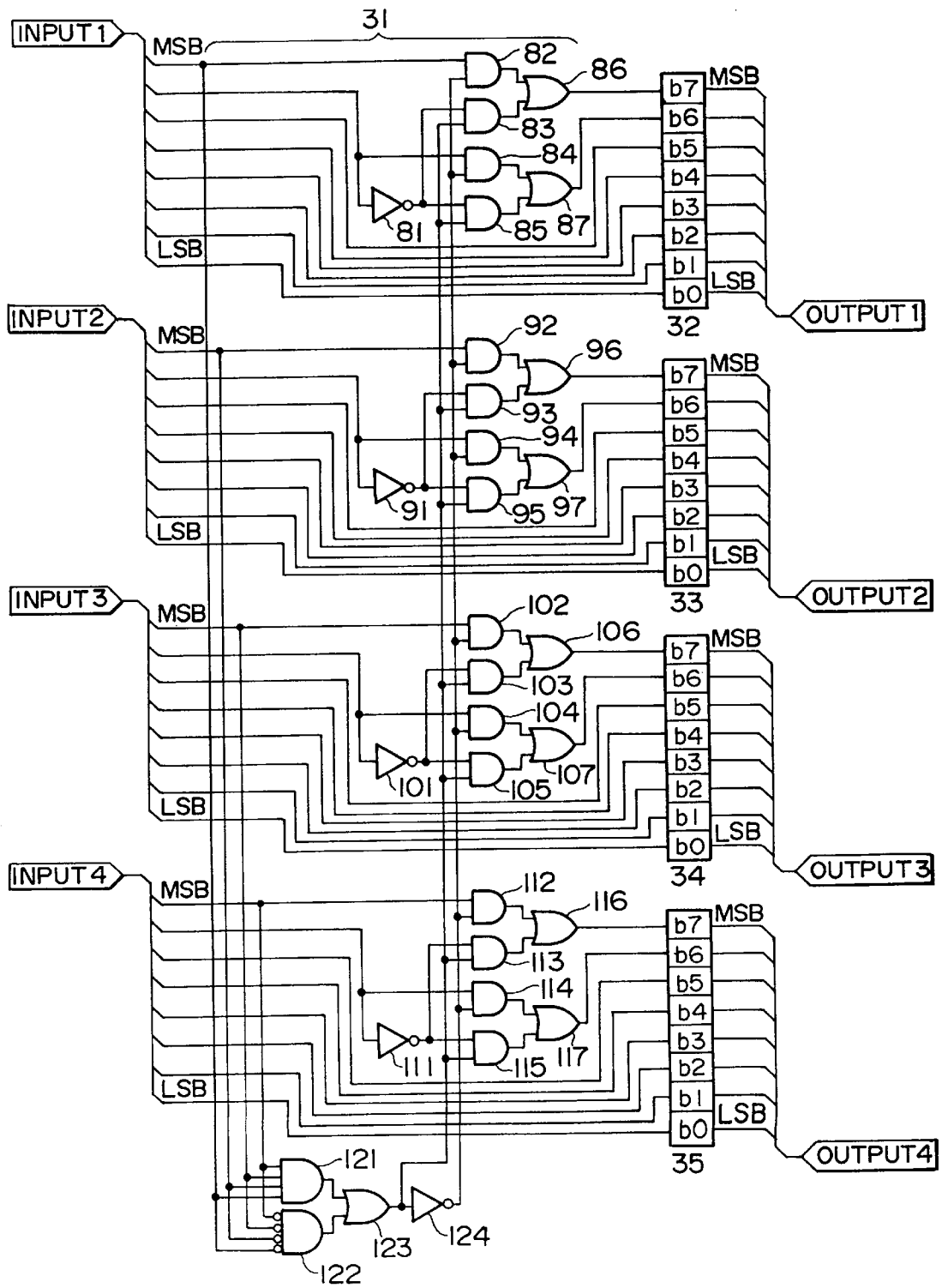
FIG. 3 is a block diagram showing a preferred embodiment of a metric memory 3 indicated in FIG. 1.

In the metric memory 3 shown in FIG. 3, the MSB of eight-bit data output from a selector 19 of the ACS circuit 2 is supplied to one input terminal of an AND circuit 82. The second bit (second most significant bit) of data output from the selector 19 is inverted by an inverter 81 and then supplied to one input terminal of an AND circuit 83 and one input terminal of an AND circuit 85. Also, without being inverted by the inverter 81, the second bit is supplied intactly to one input terminal of an AND circuit 84.

Output values from the AND circuits 82 and 83 are applied to an OR circuit 86, from which the MSB is fed to b7 of a register 32. Output values from the AND circuits 84 and 85 are applied to an OR circuit 87, from which the second bit is fed to b6 of the register 32. The remaining third to eighth bits of eight-bit data output from the selector 19 are fed intactly to b5 to b0 of the register 32.

For each eight-bit data supplied from the adder 13, 14 or a selector 20 of the ACS circuit 2, a group of inverter 91, AND circuits 92 to 95, OR circuits 96 and 97, a group of inverter 101, AND circuits 102 to 105, OR circuits 106 and 107, and a group of inverter 111, AND circuits 112 to 115, OR circuits 116 and 117 are arranged similarly to the above-mentioned group of inverter 81, AND circuits 82 to 85, OR circuit 86 and 87. After processed through these circuit groups, the MSB and second bit of each eight-bit data are fed to b7 and b6 of registers 33 to 35, respectively. Also, the remaining third to eighth bits of eight-bit data are fed intactly to b5 to b0 of registers 33 to 35, respectively.

The four input MSBs are applied to an AND circuit 121 and a NAND circuit 122, and output values of the AND circuit 121 and NAND circuit 122 are input to an OR circuit 123. Then, an output value of the OR circuit 123 is fed to one input terminal of each of the second AND circuits 83, 93, 103 and 113 and one input terminal of each of the fourth AND circuits 85, 95, 105 and 115 in the four-level circuit groups. Also, the output value of the OR circuit 123 is applied to an inverter 124, and then an output value of the inverter 124 is fed to one input terminal of each of the first AND circuits 82, 92, 102 and 112 and one input terminal of each of the third AND circuits 84, 94, 104 and 114 in the four-level circuit groups.

In the embodiment mentioned above, a normalizing circuit 31 is formed with these circuits.

If four bytes supplied from the ACS circuit 2 contain positive and negative values mixedly in the exemplified embodiment, each value is stored intactly into the registers 32 to 35 respectively. If the four values are all negative, a value equal to ¼ of a numeric value range representable by the metric memory 3 is added to each of the four values and the resultant value of addition is stored into the registers 32 to 35 respectively. If the four values are all positive, a value equal to ¼ of a numeric value range representable by the metric memory is subtracted from each of the four values and the resultant value of subtraction is stored into the registers 32 to 35 respectively. Since an eight-bit value can be represented by each of the registers 32 to 35 in the exemplified embodiment, value 40H is added to or subtracted from each of the four values if these values are all positive or negative.

If at least one of the four input values is positive and at least one of them is negative, the AND circuit 121 outputs '0' and the NAND circuit 122 outputs '0' also. Therefore, the OR circuit 123 outputs '0', causing the inverter 124 to output '1'. Thereby, the second and fourth AND circuits in each of the four-level circuit groups become nonconductive, and the first and third AND circuits in each of them become conductive. Consequently, in the topmost-level circuit group for example, the MSB input is applied to the register 32 through the AND circuit 82 and OR circuit 86 and it is retained intactly at b7 (MSB) of the register 32. Also, the second bit input is applied to the register 32 through the AND circuit 84 and OR circuit 87 and it is retained intactly at b6 (second significant bit) of the register 32.

In the second-, third- and fourth-level circuit groups, the same processing is carried out.

As shown in FIG. 4, if at least one of the four input values is positive and a least one of them is negative, the input values are stored intactly into the register 32 to 35 respectively.

If the four input values are all positive, the MSB of each input value is '0' and therefore the NAND circuit 122 outputs '1'. The OR circuit 123 outputs '1', causing the inverter 124 to output '0'. As a result, contrarily to the foregoing case, the second and fourth AND circuits in each of the four-level circuit groups become conductive, and the first and third AND circuits in each of them become nonconductive.

Consequently, in the topmost-level circuit group for example, the second bit input inverted by the inverter 81 is applied to the register 32 through the AND circuit 83 and OR circuit 86 and it is retained at b7 (MSB) of the register 32. Also, the second bit input inverted by the inverter 81 is applied to the register 32 through the AND circuit 85 and OR circuit 87 and it is retained at b6 (second significant bit) of the register 32.

In the the second-, third- and fourth-level circuit groups, the same processing is carried out.

As shown in FIG. 4, if the second bit input is '0', the MSB and second bit of each register are set to '1'. If the second bit input is '1', the MSB and second bit of each register are set to '0'. The third and eighth bits of input are stored intactly.

Further, if the four input values are all negative, the MSB of each input value is '1'. Therefore, the AND circuit 121 outputs '1', and the processing is carried out in the same manner as in the case that the four input values are all positive. Consequently, as shown in FIG. 4, if the second bit input is '0', the MSB and second bit of each register are set to '1'. If the second bit input is '1', the MSB and second bit of each register are set to '0'.

In the fashion mentioned above, if the four values input to the metric memory 3 are all positive, value 40H is subtracted from each of the four values and the resultant value of subtraction is stored into the registers 32 to 35 respectively. If the four values input to the metric memory 3 are all negative, value 40H is added to each of the four values and the resultant value of addition is stored into the registers 32 to 35 respectively.

Through normalization processing as stated above, occurrence of an overflow in the registers 32 to 35 can be prevented and also the circuit scale of the metric memory 3 can be reduced to provide a higher speed of operation.

Figures 5, 6:
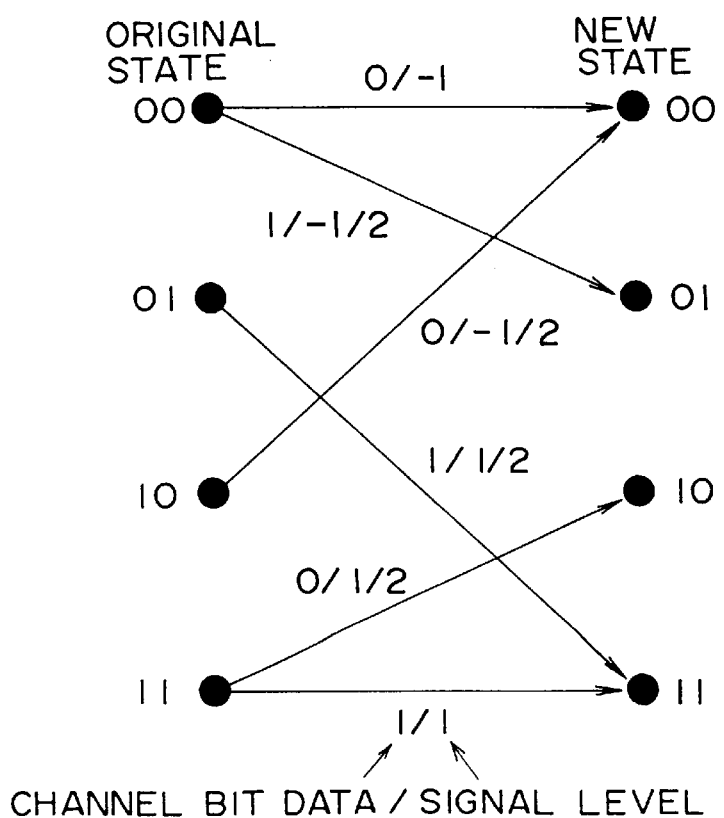
FIG. 5 is an illustration showing relationship between A/D converter output values and signal levels.
FIG. 6 is a trellis diagram showing PR (1,2,1) with minimum run limited to 1.

In case that output of the A/D converter 141 is represented in five bits, the A/D converter 141 outputs '11000' (18H), '11100' (1CH), '00100' (04H) and '01000' (08H) according to reference signal levels [−1, −½, ½, 1] as shown in FIG. 5. The most significant bit corresponds to an algebraic sign, the second bit to reference level 1, the third bit to reference level ½, the fourth bit to reference level ¼, and the least significant bit to reference level ⅛.

In a situation where a random signal is input to the Viterbi decoder shown in FIG. 1, an overflow or underflow does not occur in the adders 11 to 15 and the subtracter 142 of the ACS circuit 2. However, in an arrangement where the ACS circuit 2 and the metric memory 3 have a seven-bit structure, an overflow or underflow occurs in the adders or subtracters to cause an erroneous operation. Therefore, in case that output of the A/D converter 141 is represented in five bits, it is preferred to configure the ACS circuit 2 and the metric memory 3 in an eight-bit structure.

Further, provided that output of the A/D converter 141 is represented in four bits or more, it is possible to apply the Viterbi decoding method of the present invention. The bit width of the ACS circuit 2 and metric memory 3 may be arranged to be equal to "bit width of A/D converter+three bits".

In a situation where output of the A/D converter 141 is represented in five bits and an ideal signal amplitude is set to more than ½ of an input range of the A/D converter 141, an overflow or underflow occurs even if the ACS circuit 2 and the metric memory 3 have an eight-bit structure. Therefore, in a Viterbi decoder arrangement in which the ACS circuit 2 and the metric memory 3 are configured to have an eight-bit structure, resolution of the A/D converter 141 can be utilized most efficiently where output of the A/D converter 131 consists of five bits and the ideal signal amplitude is set to ½ of the input range of the A/D converter 141. That is, in case that output of the A/D converter 141 is represented in five bits, the Viterbi decoder configuration shown in FIG. 1 is most advantageous in reduction of circuit scale, increase in operation speed and enhancement in decoding performance.

As set forth hereinabove, in the Viterbi decoder stated in claim 1 and the Viterbi decoding method stated in claim 6, a branch metric value is calculated by squaring a difference between a sample value and each of plural reference levels and subtracting the square of the sample value from the resultant value of squaring the difference, thereby making it possible to eliminate square operation circuits for realizing reduction in circuit scale and enhancement in operation speed.

In the Viterbi decoder stated method according to still another embodiment and the Viterbi decoding stated in claim 8, if all the selected values have the same algebraic sign, a value equal to ¼ of a numeric value range representable by the metric memory means is added to or subtracted from each of the selected values and the resultant value of addition or subtraction is stored as a path metric value, thereby preventing occurrence of an overflow and making it possible to reduce the circuit scale for realizing a higher speed of operation.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and range of equivalency of the claims are therefore intended to be embraced therein.

What is claimed is:

1. A Viterbi decoder, comprising:

calculation circuit means for calculating a plurality of branch metric values using a sample value of a reproduction signal and each of a plurality of reference levels;

selection circuit means for selecting a particular value from sum data of said plurality of branch metric values output by said calculation circuit means and a plurality of path metric values corresponding to said plurality of branch metric values;

metric memory means for storing the particular value selected by said selection circuit means as one of said plurality of path metric values: and path memory means for storing path data according to selection made by said selection circuit means, wherein said calculation circuit means calculates said plurality of branch metric values by squaring a difference between said sample value and said each of said plurality of reference levels and subtracting a square of said sample value plus a predetermined constant from the squared difference.

2. A Viterbi decoder as claimed in claim 1, wherein said calculation circuit means comprises:

adder means for adding said sample value and said predetermined constant; and shifter means for shifting bits of said sample value.

3. A Viterbi decoder as claimed in claim 1, wherein if all of a plurality of values selected by said selection circuit means have a same algebraic sign, a value equal to ¼ of a numeric value range representable by said metric memory means is added to or subtracted from each of the plurality of selected values and a resultant value of the addition or the subtraction is stored as a path metric value in said metric memory means.

4. A Viterbi decoder as claimed in claim 1, wherein said sample value of said reproduction signal is represented in five bits and said selection circuit means and metric memory means have an eight-bit structure.

5. A Viterbi decoder comprising:

calculation circuit means for calculating a plurality of branch metric values using a sample value of a reproduction signal and each of a plurality of reference levels;

selection circuit means for selecting a particular value from sum data of said plurality of branch metric values output by said calculation circuit means and a plurality of path metric values corresponding to said plurality of branch metric values;

metric memory means for storing the particular value selected by said selection circuit means as one of said plurality of path metric values; and path memory means for storing path data according to selection made by said selection circuit means, wherein if all of a plurality of values selected by said selection circuit means have a same algebraic sign, a value equal to ¼ of a numeric value range representable by said metric memory means is added to or subtracted from each of the plurality of selected values and a resultant value of the addition or the subtraction is stored as a path metric value in said metric memory means.

6. A Viterbi decoding method, comprising:

a calculation step of calculating a plurality of branch metric values using a sample value of a reproduction signal and each of a plurality of reference levels;

a selection step of selecting a particular value from sum data of said plurality of branch metric values output in said calculation step and a plurality of path metric values corresponding to said plurality of branch metric values;

a first storage step of storing the particular value selected in said selection step as one of said plurality of path metric values; and a second storage step of storing path data according to selection made by said selection circuit means, wherein if all of a plurality of values selected by said selection circuit means have a same algebraic sign, a value equal to ¼ of a numeric value range representable by said metric memory means is added to or subtracted from each of the plurality of selected values and a resultant value of the addition or the subtraction is stored as said path metric value in said metric memory means.

7. A Viterbi decoding method, comprising:

a calculation step of calculating a plurality of branch metric values using a sample value of a reproduction signal and each of a plurality of reference levels;

a selection step of selecting a particular value from sum data of said plurality of branch metric values output in the calculation step and a plurality of path metric values corresponding to said plurality of branch metric values;

a first storage step of storing the particular value selected in the selection step as one of said plurality of path metric values; and a second storage step of storing path data according to selection made in the selection step, wherein the calculation step includes calculating said plurality of branch metric values by squaring a difference between said sample value and said each of said plurality of reference levels and subtracting a square of said sample value plus a predetermined constant from the squared difference.

8. A Viterbi decoder as claimed in claim 7, wherein said calculation step comprises:

adding said sample value and said predetermined constant; and shifting bits of said sample value.

9. A Viterbi decoder as claimed in claim 7, wherein said sample value of said reproduction signal is represented in five bits and said selection step and first storage step operate on an eight-bit structure.

10. A Viterbi decoder, comprising:

calculation circuit means for calculating a plurality of branch metric values using a sample value of a reproduction signal and each of a plurality of reference levels;

selection circuit means for selecting a particular value from sum data of said plurality of branch metric values output by said calculation circuit means and a plurality of path metric values corresponding to said plurality of branch metric values;

metric memory means for storing the particular value selected by said selection circuit means as one of said plurality of path metric values; and path memory means for storing path data according to selection made by said selection circuit means, wherein said calculation circuit means comprises:
adder means for adding said sample value and a predetermined constant; and
shifter means for shifting bits of said sample value.

11. A Viterbi decoder, comprising:

calculation circuit means for calculating a plurality of branch metric values using a sample value of a reproduction signal and each of a plurality of reference levels;

selection circuit means for selecting a particular value from sum data of said plurality of branch metric values output by said calculation circuit means and a plurality of path metric values corresponding to said plurality of branch metric values;

metric memory means for storing the particular value selected by said selection circuit means as one of said plurality of path metric values; and path memory means for storing path data according to selection made by said selection circuit means, wherein said sample value of said reproduction signal is represented in five bits and said selection circuit means and metric memory means have an eight-bit structure.

* * * * *